(12) United States Patent
Waitl et al.

(10) Patent No.: US 6,858,879 B2
(45) Date of Patent: Feb. 22, 2005

(54) DIODE HOUSING

(75) Inventors: Gunther Waitl, Regensburg (DE); Herbert Brunner, Regensburg (DE)

(73) Assignee: Osram Opto Semiconductors GmbH (DE)

( * ) Notice: Subject to any disclaimer, the term of this patent is extended or adjusted under 35 U.S.C. 154(b) by 29 days.

(21) Appl. No.: 10/616,070

(22) Filed: Jul. 9, 2003

(65) Prior Publication Data

US 2004/0104445 A1 Jun. 3, 2004

Related U.S. Application Data

(62) Division of application No. 09/754,043, filed on Dec. 29, 2000, now Pat. No. 6,624,491, which is a continuation of application No. PCT/DE99/01912, filed on Jun. 30, 1999.

(30) Foreign Application Priority Data

Jun. 30, 1998 (DE) .......................................... 198 29 197

(51) Int. Cl.[7] .............................................. H01L 33/00
(52) U.S. Cl. .......................... 257/99; 257/434; 257/680
(58) Field of Search ............................ 257/99, 79–103, 257/434, 680

(56) References Cited

U.S. PATENT DOCUMENTS

| 5,296,724 | A | * | 3/1994 | Ogata et al. .................. 257/98 |
| 5,925,898 | A | * | 7/1999 | Spath .......................... 257/98 |
| 5,985,696 | A | | 11/1999 | Brunner et al. |
| 6,066,861 | A | | 5/2000 | Hahn et al. |
| 6,459,130 | B1 | | 10/2002 | Arndt et al. |

FOREIGN PATENT DOCUMENTS

| JP | 62-224986 | 10/1987 |
| JP | 425260 | 2/1992 |
| JP | 07202317 A | 4/1995 |
| WO | WO 97/12404 | 4/1997 |
| WO | WO 98/12757 | 3/1998 |

OTHER PUBLICATIONS

Patent Abstracts of Japan, Japanese Patent Office, Pub. No. 6224986A.
English Language Translation of JP 62–224986 (ABSTRACT).
English Language Translation of JP 4–25260 (ABSTRACT).

(List continued on next page.)

*Primary Examiner*—George Fourson
*Assistant Examiner*—Michelle Estrada
(74) *Attorney, Agent, or Firm*—Fish & Richardson P.C.

(57) ABSTRACT

A housing accommodating a semiconductor chip is set out. The housing and chip may be used for sending and/or receiving radiation. Popular applications of the housing may be in light emitting diodes. The housing includes a conductor strip that is punched into two electrically isolated portions. The housing further includes a cavity extending inwards from the top of the housing. The conductor portions include respective areas that are exposed at the bottom of the cavity. The semiconductor chip is bonded to one of the exposed areas and a wire bonds the chip to the second exposed area. The conductor portions also terminate in exposed electrodes, which allow for electrical connection of the chip with external devices. A window is formed in the cavity and the walls of the housing that form the cavity may be made of a reflective material. The electrodes remain unexposed to the window but for any residual areas about the chip and bonding wire within the first and second exposed areas. By minimizing the area of the conductor exposed to the window, delamination brought about by the different thermal expansions of the window and conductor are minimized and/or eliminated. Likewise, with a reflective housing covering the base of the cavity that accommodates the window, internal radiation reflection is increased over that which was achieved with an exposed conductor.

13 Claims, 2 Drawing Sheets

OTHER PUBLICATIONS

Patent Abstracts of Japan, Pub. No. 07202317A, (English), pp. 1.

English Abstract of Japanese Application Pub. No. 07202317 A (English), pp. 1.

Machine language translation of Japanese Application Pub. No. 07202317A (English), pp. 7.

Frank Mollmer et al., Siemens–SMT–TOP–LED–LED'S for Surface Mounting; Siemens Components, XXVI, vol. 26, Nr. 4/5, pp. 147–149, Oct. (1991).

* cited by examiner

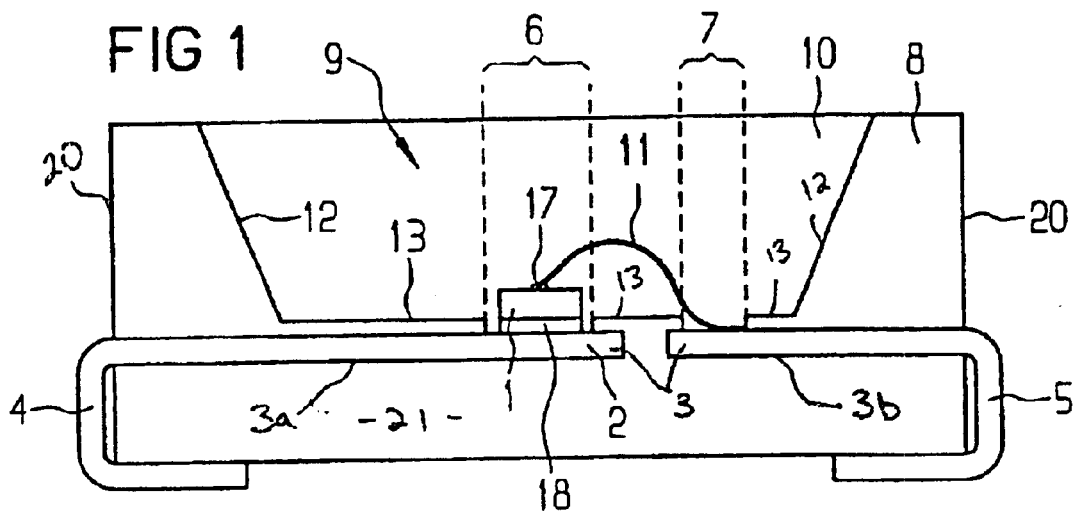
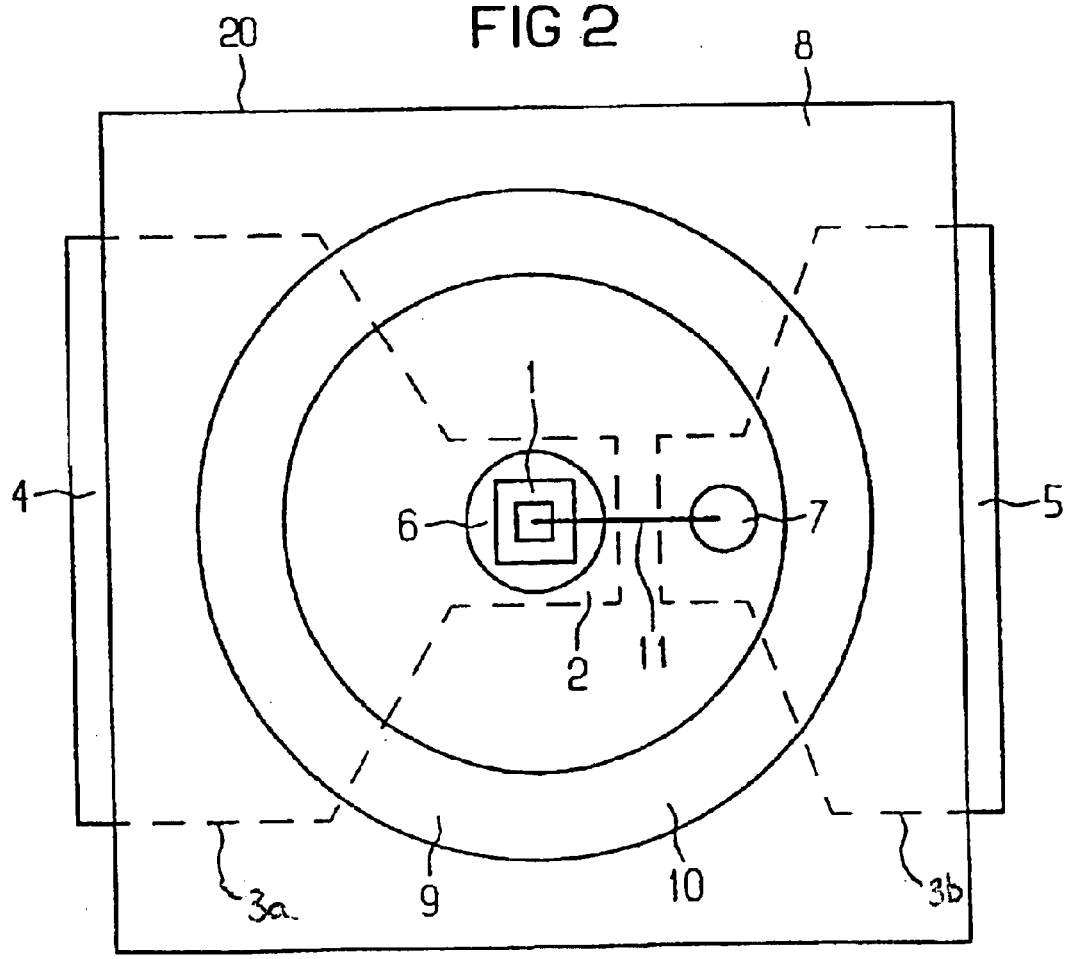

DIODE HOUSING

CROSS-REFERENCE TO RELATED APPLICATION

This application is a Divisional of U.S. patent application Ser. No. 09/754,043, filed Dec. 29, 2000 now U.S. Pat. No. 6,624,491, which is a continuation of copending international application PCT/DE99/01912 filed Jun. 30, 1999 which designated the United States.

BACKGROUND OF THE INVENTION

1. Field of the Invention

The present invention relates to the field of optoelectronic components and more particularly to an improved housing design for a radiation sending and/or receiving device. Such device may comprise one or more optoelectronic chips, which are generally mounted on a chip supporting part of an electrical lead frame running through a base body. Common applications for such chips may include light emitting diodes (LED).

2. Description of Related Art

Housings for radiation sending and/or receiving devices are generally well known in the art. An example of prior art housings is set out in an article "Siemens-SMT-TOP-LED-LED's for Surface Mounting", Siemens Components XXVI (1991), Nos. 4–5, pages 147 to 149. This article is herein incorporated by reference. The article discusses the state of the art, as of 1991, of surface mounted TOP LED's. A side by side comparison of TOP and radial LEDs is set out in FIG. 4 of the article. A perspective view of a TOP LED is shown in FIG. 1 of the article. The figure depicts a rounded portion at the top of the LED along with a side protruding conductor strip or electrode. FIG. 2, of the article, sets or depicts a cross section of the LED suggested in FIG. 1. Herein, a punched conductor strip 1 is encased in a thermoplastic package 2. The package 2 includes a top and bottom portion, the bottom portion being surrounded by the protruding conductor strip ends. The top portion of the package includes slanted, reflective and opposing sidewalls 3. The sidewalls form a circular opening in the top portion of the package within which is mounted semiconductor chip 4. The chip is consecutively mounted on a first portion of the punched conductor strip and further electronically connected (via a bonding wire) with the second portion of the punched conductor strip. The circular opening created by the sidewalls 3 is filled with a transparent epoxy resin. The resin is chosen such that the resin and package material are carefully balanced such that peak thermal stress will not cause mechanical damage. No such consideration is given to the selection of conductor strip 1 material. In operation, where, for example, the chip emits radiation, such radiation is reflected by the side walls 3 and emitted upwards through the window. Returning to FIG. 4 of the article, the SMT LED is mounted within a case and optically coupled to a light guide to the front panel of the case. Application of LED technology includes visual displays both in harsh environments, such as engine compartments, and non-harsh environments, such as home displays.

An embodiment resembling the TOP LED is set out in the instant FIG. 4. Herein, a housing 109 is depicted being generally made of a synthetic reflective material, such as a highly diffusive thermoplastic material as known to one skilled in the art. In the housing 109, a radiation emitting semiconductor chip 101 is mounted on a flat chip carrier portion 102 of a flat surface area of a punched metallic conductor 103. The conductor 103 is punched into two opposing, electrically isolated first and second portions, 103a and 103b, respectively, with chip 101 being mounted on the first portion 103a. The first portion further ends in an external connector 104. Portion 104 facilitates transmission of electrical signals with chip 101, from an external apparatus (not shown), via first portion 103a and carrier portion 102. Chip 101, via bonded wire 111, is electrically connected to second portion 103b of the metal carrier frame. In particular, wire 111 is bonded at area 107 of the second portion 103b. The second portion further ends in external connector 105 which facilitates communication of electrical signals with chip 101, from an external apparatus (not shown) via area 107 of second portion 103b and the connecting wire. Housing 109 further accommodates a transparent window 110 located above and around semiconductor chip 101. The window may be made of any appropriate synthetic material known to one skilled in the art. A top portion of the window 110 is coplanar with a top surface of housing 109. The side and bottom surfaces of window 110 are defined by cooperation of side wall 120 surfaces 112 and carrier frame 103. Sidewall surfaces 112 are angled with respect to frame 103. Side wall surfaces 112 and portions of carrier frame 103 that directly abut window 110 may have reflective properties for select or all radiation present within window 110. Semiconductor 101 may be radiation emissive and/or receptive.

A drawback with the above discussed arrangements, as briefly alluded to in the prior art reference, stems from the delamination of the window 110 carrier frame 103. Such delaminating may result from temperature variations in the housing's operating environment, such as proximate to an automobile engine or manufacturing (e.g. soldering) requirements. The temperature variations effect the thermal coefficients of the window, side walls and carrier frame causing dimensional changes in each at possibly differing rates. By way of example, frame 103 may be metal and window 110 may be a transparent epoxy resin. Hence, as a result of temperature fluctuations, the window 110 often separates from frame 103. Such gaps result in radiation absorption and/or internal reflections thereby diminishing the amount of radiation being emitted from or incident to chip 101. Hence the operating efficiency of the entire housing is effected. Furthermore, the gap can continue between carrier frame and window to sidewalls 120 starting from the gap between carrier frame 103 and window 110 thereby opening the housing up to moisture penetration which will damage the chip and accelerate delimitation.

U.S. Pat. No. 5,985,696 sets out application of a semiconductor chip in a rounded LED. The reference discloses a method for producing optoelectric semiconductor components wherein the chip carrier is supported by a plastic base and electrodes run through the base. A lens is further mounted above the chip. A cap is form fitted to a holder and attached with the base. The plastic base is one of many arranged successively in a chip carrier strip. The base is injection molded and the component is separated from the chip carrier strip only after the base is produced, the chip is attached and bonded to the electrodes.

U.S. Pat. No. 6,066,861 sets out an arrangement for a white light emitted diode. The arrangement includes an inorganic luminous substance pigment powder with luminous substance pigments dispersed in a transparent epoxy casting resin. The material is spaced proximate to a semiconductor radiation source such that the material luminesces, thereby converting the source radiation into a second wavelength. FIG. 3 sets out an embodiment whereby angled sidewalls and a base cooperate to form a bound area for the luminescing material.

German patent DE 19536454 discloses a semiconductor chip mounted on a lead frame and housed in a recess of a component base. A reflective layer is coated on the lead frame so as to reflect radiation emitting from the chip. Angled sidewalls further cooperate with a planar base to form the boundaries of the window.

BRIEF SUMMARY OF THE INVENTION

It is accordingly an object of the invention to provide an improved housing arrangement for a radiation emitting and/or receiving semiconductor chip to use in TOP LEDs, rounded LEDs and the like. It is a further object to provide a component, which can be implemented so as to enable mass production at reasonable engineering effort and expense and with maximally replicable component characteristics. It is still a further object of the present invention to prolong the life of the component via improved delamination resistance as well as improved radiation reception and emission characteristics. In still a further object of the present invention to increase radiation input/output efficiency with the semiconductor chip.

With the foregoing and other objects in view there is provided, in accordance with the invention, a basic component design includes a housing having a top portion and a base, said top portion including side walls defining an opening with an open top and a closed bottom; a conductor accommodated within said housing, said conductor having two electrically isolated portions, a first portion having a first end terminating in an electrode external to said housing and a second end having a first open area exposed along said closed bottom such that said first portion is substantially surrounded by said housing but for said open area, and a second portion having a third end terminating in an electrode external to said housing and a fourth end having a second open area exposed along said closed bottom such that said second portion is substantially surrounded by said housing but for said second open area; a semiconductor chip bonded to said first open area such that said semiconductor chip is positioned within said opening and said first open area is limited in area by said housing to substantially only accommodating said semiconductor chip; a wire having a first end bonded to said semiconductor chip and a second end bonded to said second open area such that said wire is positioned within said opening and said second open area is limited by said housing to substantially only accommodate said wire bond; and a window formed within said opening such that a top of said window is coplanar with a top of said housing. By this arrangement, delamination between the window and conductor is minimized and/or essentially eliminated.

In a second embodiment, the first and second conductor portions are in a first plane and said first and second open area are in a second plane. This can be effected by cropping the conductor strips such that the surface area reserved for bonding the semiconductor chip and wire are elevated above the remaining strip area of the same plane. As such, the conductor strips or portions may reside together in a first plane or individually in a first and second plane; and the open areas may likewise reside in a third plane together or in a third and fourth plane individually. Further by this arrangement, the bottom surface of the opening is essentially planar, such that contact between the transparent window accommodated within the opening and the conductor, now accommodated within the housing below the opening bottom surface, is minimized such that delamination between the window and conductor are essentially reduced or eliminated.

By these arrangements numerous design and manufacturing liberties can be taken so as to accommodate complex circuit designs while still maintaining the otherwise minimum contact between window resin and conductor strip. An additional advantage presented by these designs is that the component can be manufactured with otherwise known injection molding and easily fitted into both SMT TOP LED designs as well as rounded designs as would be known to one skilled in the art. An additional advantage lies in the reduction of exposed conductor strip area to incident and/or emitted radiation. Conductor strips have lower incidence of reflection as compared to reflective surfaces normally mounted on the body sidewalls. Likewise, more radiation is generally absorbed by the conductor strips as the reflective sidewalls. As such, minimization of the conductor strip exposure minimizes dark areas and other inefficiencies caused by the strips interactions with incident and/or emitted radiation, with respect to the semiconductor chip. The gains achieved can be further enhanced by selection of a highly reflective synthetic resin for the body material thereby increasing reflection as from the conductor strips by, for example, 80% or more. Any suitable reflective material may be used as known to one skilled in the art.

The invention is explained in greater detail below by reference to exemplary embodiments shown in the drawings.

BRIEF DESCRIPTION OF THE DRAWINGS

FIG. 1 depicts a longitudinal cross section of a first embodiment of the present invention;

FIG. 2 depicts a top view of the first embodiment;

DESCRIPTION OF PREFERRED EMBODIMENTS

Figure 3:
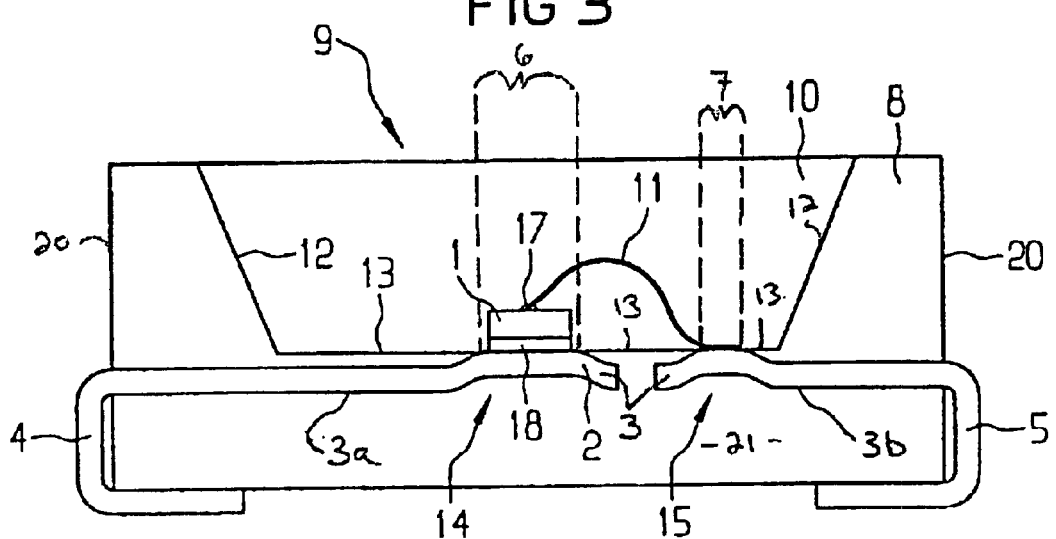
FIG. 3 depicts a longitudinal cross section of a second embodiment of the present invention.

Reference is now made to the figures of the drawings in which elements that are identical or that function identically are identified by the same reference numerals throughout. FIGS. 1 and 2 set out the first embodiment of the present invention which comprises an LED component part for use in SMT or related technology. The component comprises a lead frame 3, accommodating a semiconductor chip 1 on a first conductor portion 3a and a first end of wire 11 is bonded to a second conductor portion 3b. A second end of wire 11 is bonded 17 to semiconductor 1. A housing 20, made of synthetic materials known to one skilled in the art, accommodates the conductor, chip and wire. Portion 3a extends outwards from and around a base 21 of housing 20 thereby forming external conductor 4. Likewise, second conductor 3b extends outwards from and around the base 21 of housing 20 thereby forming external conductor 5. A top of the component is formed by the housing 20 and an opening therein and cavity 9 extending thereinbelow is further defined by cooperating sidewalls 12 and bottom walls 13 of housing 20. Sidewalls 12 are positioned at an obtuse angle to a plane defined by the conductor 3.

The semiconductor chip includes two metalization layers 17 and 18 thereon. The contact metalization 18 bonds a first surface of chip 1 to first portion 3a at location 2 thereby effecting an electrical connection between the chip and external electrode 4. The chip 1 is bonded to first portion 3a at second open area 6. Contact metalization 17 bonds wire 11 to a second surface of chip 1. Wire 11 is also bonded to second portion 3b at second open area 7. The bonded wire effects an electrical connection between external electrode 5 and chip 1. The wire and bonding material may be made of any material known to one skilled in the art for effecting an electrical connection, including gold, silver and others.

As set out above, housing 20 side walls 12 cooperate with elongated bottom walls 13 which extend along a substantially coplanar direction towards one another from opposing starting points on the side walls. Elongated portions 13 cover portions of the conductor strip not defined by first and second open areas 6 and 7. The thickness of the elongated portions 13 cover is a matter of design choice provided that it is of at least a thickness so as to prevent any delamination due to harmful interaction of window 10 and conductor 3 as well as radiation absorption by conductor 3. Such thickness can be determined on a case by case basis by means known to one skilled in the art. Opening 9 accommodates a suitable radiation permeable window 10, which may be composed of a transparent epoxy resin or other known materials. Borders of window 10 are defined by cooperating sidewalls 12 and bottom walls 13. All or select portions and/or combinations of the housing material may be made of any highly reflective suitable material known to one skilled in the art. Such material is intended to provide better reflectivity than the exposed conductor 3 and has preferably a diffuse reflectivity of at least 80%. However, it is noted that the function of the invention is still effected by the use of non-reflective materials for housing 20 provided that such material is made to cover the conductive strip but for first and second open areas 6 and 7 such that delamination between window and conductor is minimized and/or substantially eliminated. Through the bottom walls covering of the bulk of the exposed conductor strip, delamination arising from between window 10 and conductor 3 is effectively reduced and/or eliminated. The operating life of the component is thereby increased. And when the housing material is made of a highly reflective material, the efficiency of the component is increased due to the increased incident and emission to and from chip 1.

FIG. 2 depicts a top view of the first embodiment of the present invention. As shown, side walls 8 define a circular opening 9 within which window 10 is formed. Within cavity 9, square semiconductor chip 1 is formed on first portion 3a of lead frame 3. A first opening 6 about chip 1 is formed at location 2 of the first position. Bonding wire 11, connected to chip 1, is further bonded to second conductor portion 3b at second opening 7. Both openings 6 and 7 are selected and effected so as to accommodate a particular semiconductor chip selected in advance by design. In addition, both openings may be circular. The openings are reserved from injection molding by techniques known in the art. Likewise, the open areas 6 and 7 may be of any shape suitable for effecting connection of chip 1 and wire 11 to first and second conductor portions 3a and 3b respectively. Conductor 3 is shown punched into two opposing fan shaped portions 3a and 3b. However, it is within the scope of this invention that other shapes and numbers thereof may be effected provided that such other shapes and numbers are likewise covered by the housing material 20 elongated portions 13 as is shown and described herein. External electrodes 4 and 5 are also depicted as extending from first and second portions 3a and 3b respectively.

FIG. 3 depicts a second embodiment of the present invention. As with the first embodiment, herein the inventive component comprises a chip 1 and wire 11 bonded to first 3a and second 3b portions of a conductor strip accommodated in housing 20, the housing further including a top opening 9 defined by obtuse side walls 12 and bottom walls 13 further which accommodate a window therein. A difference between the two embodiments lay in the shape of the conductor 3. Herein, the conductor is bowed or otherwise cropped. First conductor portion 3a includes a first cropping 14 which rises above and then remains parallel with the remainder of the first portion 3a. The surface area of first cropping 14 is sufficiently large and/or thick so as to accommodate semiconductor chip 1 thereon. Chip 1 is bonded by bonding material 18 to a first open area 6 as discussed above. As such, the first cropping is of sufficient magnitude so as to accommodate the first open area. Second conductor portion 3b includes a second cropping 15 shaped similarly to first cropping 14. Second cropping 15 is also of sufficient magnitude so as to accommodate the bonding of wire 11 at second open area 7. Wire 11 is bonded both to second cropping 15 and chip 1 via material and operation discussed above. First and second cropping need not be identical provided they are of sufficient magnitude to accommodate chip 1 and wire 11 thereon. As such, in this second embodiment, a base plane on which chip 1 and wire 11 are bonded comprises cooperating bottom walls 13 and first and second croppings 14 and 15. It should be understood that the invention is not limited to a planar design and the croppings and elongated portions may be of any other geometrical relationship, envisioned by one skilled in the art, provided that the above discussed connections are maintained and contact between window 10 and conductor 3 is minimized or otherwise eliminated. Lastly, the shape and tenor of the croppings is a matter of design choice limited to the aspect that the surface area of the conductor made available for the chip and wire bonding is of sufficient integrity so as to accommodate the respective chip and wire bonding thereon.

Figure 4:
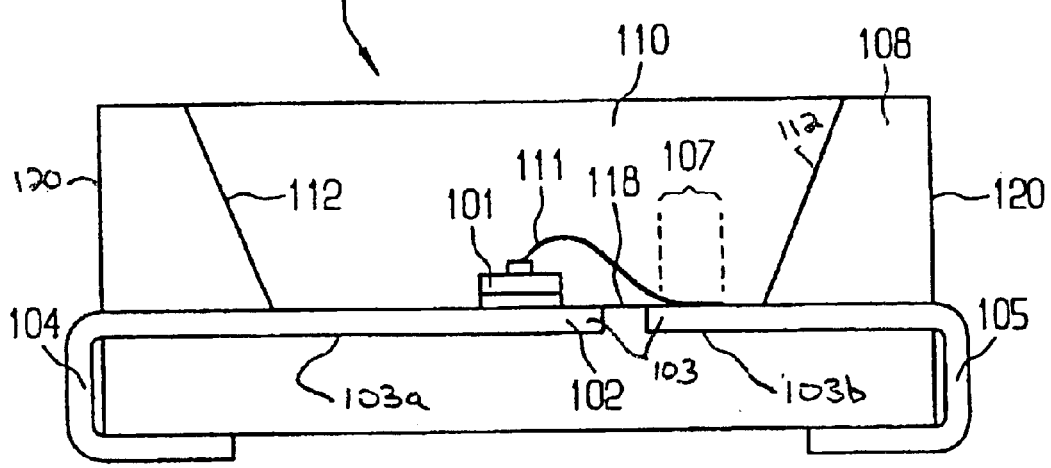
FIG. 4 depicts a longitudinal cross section of a prior art embodiment.

FIG. 4, as set out above, depicts a prior art arrangement for accommodating a semiconductor chip.

The invention being thus described, it will be obvious that the same may be varied in many ways. Such variations are not to be regarded as a departure from the spirit and scope of the invention, and all such modifications would be obvious to one skilled in the art are intended to be included within the scope of the following claims.

We claim:

1. An electromagnetic radiation emitting or receiving surface mountable semiconductor device, comprising:

a housing including an opening with an open top, a closed bottom and sides connecting said closed bottom and said open top and a bottom wall at the closed bottom;

a conductor accommodated within said housing, said conductor having at least one first conductor portion and at least one second conductor portion being electrically isolated from each other;

at least one semiconductor chip positioned within said opening; and a wire having a first wire end bonded to said at least one semiconductor chip and a second wire end bonded to said at least one second conductor portion such that said wire is positioned within said opening; wherein said opening forms a window for sending or receiving electromagnetic radiation;

said first conductor portion has a first conductor end terminating in a first electrode external to said housing and a second conductor end extending along said opening and having a first open area exposed along said closed bottom such that said first conductor portion is substantially surrounded by said housing but for said first electrode and said first open area;

said second conductor portion has a third conductor end terminating in a second electrode external to said housing and a fourth conductor end extending along said opening and having a second open area exposed along said closed bottom such that said second conductor portion is substantially surrounded by said housing but for said second electrode and said second open area;

said bottom wall is positioned between said closed bottom and said second and fourth conductor ends such that said first and second open areas remain exposed;

said at least one semiconductor chip is bonded to said first open area; and said second wire end is bonded to said second open area.

2. The semiconductor device according to claim 1, wherein said first and second open areas are the only parts of said first and second conductor portions that are exposed within said opening.

3. The semiconductor device according to claim 1, wherein said first and second conductor portions are coplanar.

4. The semiconductor device according to claim 1, wherein said second and fourth conductor ends are in a first plane and said first and second open areas are in a second plane.

5. The semiconductor device according to claim 1, wherein said second and fourth conductor ends are in a first plane and said first and second electrodes are in a second plane.

6. The semiconductor device according to claim 1, wherein said housing is made of a reflective material wherein at least said closed bottom is reflective for said radiation.

7. The semiconductor device according to claim 6, wherein said reflective material features a diffuse reflective degree of at least 80%.

8. The semiconductor device according to claim 1, wherein said first and second electrodes wrap around a portion of said housing.

9. The semiconductor device according to claim 8, wherein said first and second electrodes terminate on an external rear side of said housing which does not face the said window.

10. The semiconductor device according to claim 1, wherein said second conductor end features a first offset comprising said first open area and said fourth conductor end features a second offset comprising the second open area.

11. The semiconductor device according to claim 10, wherein said first and second offsets are offset toward said opening.

12. The semiconductor device according to claim 4, wherein said second conductor end features a first offset comprising said first open area and said fourth conductor end features a second offset comprising the second open area.

13. The semiconductor device according to claim 12, wherein said first and second offsets are offset toward said opening.

* * * * *